US008541267B2

(12) United States Patent
Sonsky et al.

(10) Patent No.: US 8,541,267 B2
(45) Date of Patent: Sep. 24, 2013

(54) FINFET TRANSISTOR WITH HIGH-VOLTAGE CAPABILITY AND CMOS-COMPATIBLE METHOD FOR FABRICATING THE SAME

(75) Inventors: Jan Sonsky, Leuven (BE); Anco Heringa, Waalre (NL)

(73) Assignee: NXP B.V., Eindhoven (NL)

(*) Notice: Subject to any disclaimer, the term of this patent is extended or adjusted under 35 U.S.C. 154(b) by 138 days.

(21) Appl. No.: 12/933,414

(22) PCT Filed: Mar. 20, 2009

(86) PCT No.: PCT/IB2009/051183
§ 371 (c)(1),
(2), (4) Date: Sep. 18, 2010

(87) PCT Pub. No.: WO2009/116015
PCT Pub. Date: Sep. 24, 2009

(65) Prior Publication Data
US 2011/0006369 A1    Jan. 13, 2011

(30) Foreign Application Priority Data
Mar. 20, 2008   (EP) .................................. 08102836

(51) Int. Cl.
H01L 21/00    (2006.01)
H01L 21/84    (2006.01)
H01L 21/336   (2006.01)
H01L 29/66    (2006.01)

(52) U.S. Cl.
USPC ..... 438/157; 438/283; 257/331; 257/E21.014

(58) Field of Classification Search
USPC ............... 438/157, 176, 195, 283; 257/331, 257/347, E21.411, E29.273
See application file for complete search history.

(56) References Cited

U.S. PATENT DOCUMENTS

| | | | |
|---|---|---|---|
| 4,996,574 A | 2/1991 | Shirasaki | |
| 6,835,609 B1 | 12/2004 | Lee | |
| 2002/0153587 A1 | 10/2002 | Adkisson et al. | |
| 2003/0122186 A1* | 7/2003 | Sekigawa et al. | 257/316 |
| 2005/0136582 A1 | 6/2005 | Aller et al. | |
| 2005/0236663 A1* | 10/2005 | Pawlak | 257/330 |
| 2006/0170031 A1 | 8/2006 | Kang et al. | |
| 2007/0059873 A1 | 3/2007 | Chini et al. | |
| 2007/0221956 A1* | 9/2007 | Inaba | 257/197 |
| 2007/0228425 A1 | 10/2007 | Miller et al. | |
| 2008/0067587 A1* | 3/2008 | Gossner et al. | 257/336 |
| 2008/0197417 A1* | 8/2008 | Parthasarathy et al. | 257/367 |

FOREIGN PATENT DOCUMENTS

JP    2002270851 A    9/2002

* cited by examiner

Primary Examiner — Daniel Luke
Assistant Examiner — Khaja Ahmad

(57) ABSTRACT

The present invention relates to a method for fabricating a FinFET on a substrate. The method comprises providing a substrate with an active semiconductor layer on an insulator layer, and concurrently fabricating trench isolation regions in the active semiconductor layer for electrically isolating different active regions in the active semiconductor layer from each other, and trench gate-isolation regions in the active semiconductor layer for electrically isolating at least one gate region of the FinFET in the active semiconductor layer from a fin-shaped channel region of the FinFET in the active semiconductor layer.

19 Claims, 8 Drawing Sheets

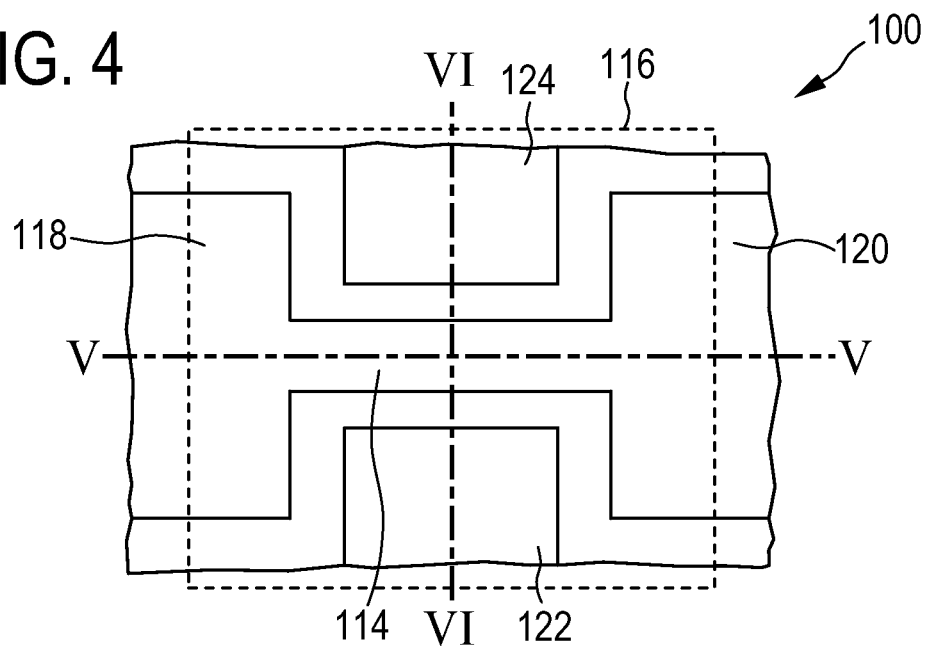
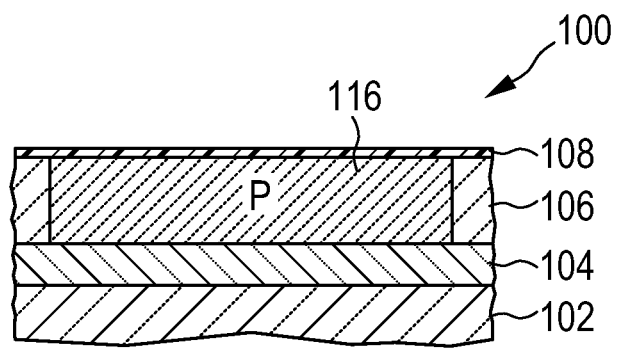
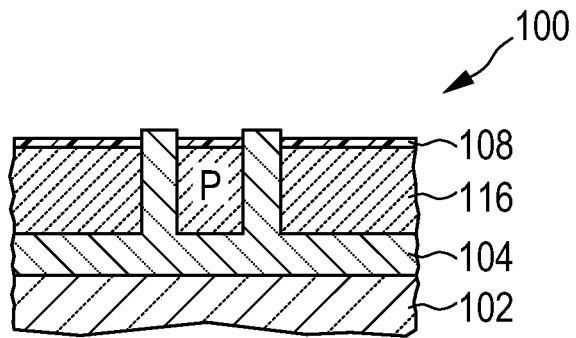

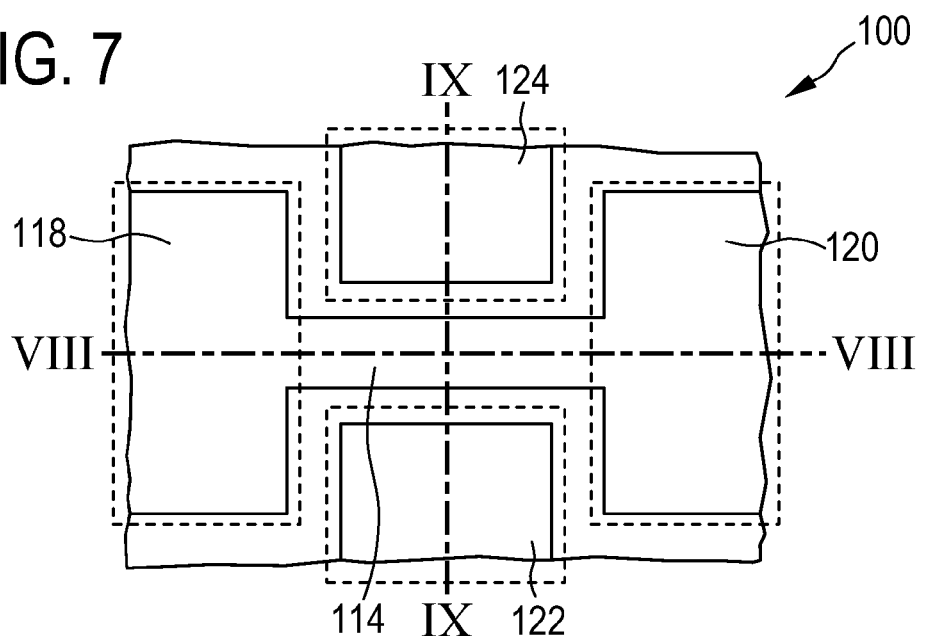
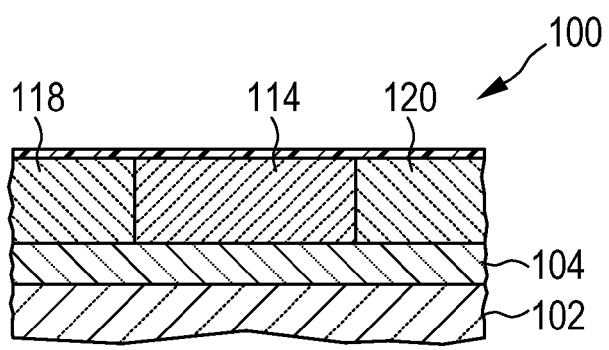
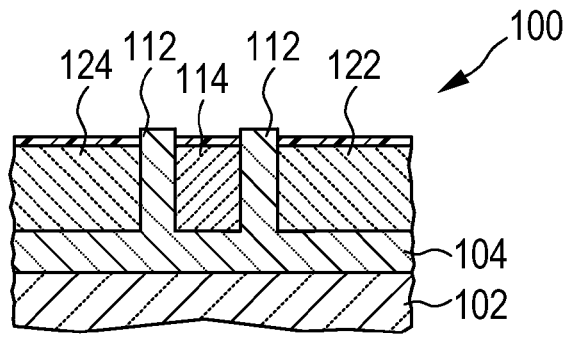

FINFET TRANSISTOR WITH HIGH-VOLTAGE CAPABILITY AND CMOS-COMPATIBLE METHOD FOR FABRICATING THE SAME

FIELD OF THE INVENTION

The present invention relates to a FinFET and to a method for fabricating a FinFET on a substrate.

BACKGROUND OF THE INVENTION

A FinFET is a transistor architecture of the metal-oxide-semiconductor field-effect transistor (MOSFET) type, which is favored as a replacement for planar MOSFET transistors in future integrated circuits fabricated in MOS technology, such as NMOS, PMOS, CMOS or BiCMOS.

A FinFET comprises a fin-shaped channel region that stands vertically on a substrate surface. The substrate surface is assumed as being oriented horizontally for the purpose of this description. In contrast to planar MOSFET transistors, which have a channel region in parallel orientation to the substrate surface, FinFETs allow superior channel charge control even at extremely short gate lengths.

U.S. Pat. No. 6,835,609 discloses a method of forming a double-gated SOI channel transistor comprising the following steps. A substrate having an SOI structure formed thereover is provided. The SOI structure including a lower SOI silicon oxide layer and an upper SOI silicon layer. The SOI silicon layer is patterned to form a patterned silicon layer. A dummy layer is formed over the SOI silicon oxide layer and the patterned SOI silicon layer. The dummy layer is patterned to form a damascene opening therein exposing: a portion of the lower SOI silicon oxide layer; and a central portion of the patterned SOI silicon layer to define a source structure and a drain structure. Patterning the exposed lower SOI silicon oxide layer to form a recess. Gate oxide layer portions are formed around the exposed portion of the patterned SOI silicon layer. A planarized layer portion is formed within the final damascene opening. The planarized layer portion includes a bottom gate and a top gate. The patterned dummy layer is removed to form a double gated SOI channel transistor.

US 2002/153587 discloses a double gated silicon-on-insulator (SOI) MOSFET is fabricated by using a mandrel shallow trench isolation formation process, followed by a damascene gate. The double gated MOSFET features narrow diffusion lines defined sublithographically or lithographically and shrunk, damascene process defined by an STI-like mandrel process. The double gated SOI MOSFET increases current drive per layout width and provides low output conductance.

SUMMARY OF THE INVENTION

According to a first aspect of the invention, a method for fabricating a FinFET on a substrate is provided. The method comprises:
providing a substrate with an active semiconductor layer on an insulator layer; and
concurrently fabricating trench isolation regions in the active semiconductor layer for electrically isolating different active regions in the active semiconductor layer from each other, and trench gate-isolation regions in the active semiconductor layer for electrically isolating at least one gate region of the FinFET in the active semiconductor layer from a fin-shaped channel region of the FinFET in the active semiconductor layer.

The method of the present invention is based inter alia on the recognition that for application in power integrated circuits, e.g. color plasma display drivers for mobile or home appliances, MOSFET transistors are required with high-voltage capability on both drain and gate, and very compact design. The continuous scaling of conventional trench isolation techniques such as, for instance shallow trench isolation (STI) in modern CMOS technologies has reached values of the trench width, which are comparable to the thickness of a gate-isolation layer used in transistors for high-gate voltage applications. The present invention uses a concurrent fabrication of trench isolation regions and trench gate-isolation regions to simplify the fabrication of a FinFET with high-voltage capability. The fabrication of the gate-isolation regions is thus performed at the same time as the fabrication of the trench isolation regions. The method of the present invention thus comprises fabricating the gate-isolation regions using a trench isolation process. An example of a suitable trench isolation process is the shallow-trench isolation technique (STI). Using the STI technique, the trench width can for instance be as low as 110 nm in a 65 nm CMOS process.

The method of the present invention thus provides a considerable simplification of the fabrication process of compact high-voltage FinFET transistors. This minimizes the total chip area and cost per chip in applications that require the use of high-voltage MOSFET transistors.

In the following, embodiments of the method of the first aspect of the invention will be described. The additional features of the embodiments can be combined to form further embodiments, unless certain embodiments are explicitly described as forming alternatives to each other.

In one embodiment, concurrently fabricating the trench isolation regions and the trench gate-isolation regions comprises:
fabricating first trenches in the active semiconductor layer for the trench isolation regions and second trenches in the active semiconductor layer for trench gate-isolation regions; and
filling the first trenches and the second trenches with an insulating material, thus providing the trench isolation regions and the gate isolation regions.

The first and second trenches can have identical trench widths. However, the trench width of the first and second trenches can also be different from each other, where either the trench isolation regions or the trench gate-isolation regions are required with a larger trench width.

The concurrent fabrication of the trench isolation regions and of the trench gate-isolation regions is particularly simple if a lithographic process is employed with a single mask for defining the trench isolation regions and the trench gate-isolation regions. As mentioned before, suitably an STI technique, which as such is well known in the art, can be used for fabricating both types of isolation regions. The process context is preferably a silicon-on-insulator (SOI) process, such as an SOI CMOS process. However, the invention is also applicable, if other active semiconductor layers than silicon are used. For instance, silicon-germanium can be used as the active semiconductor layer. Other semiconductor materials may be used as well, depending on the application and processing requirements.

The filling of the trench isolation regions and of the trench gate-isolation regions may be performed by depositing silicon dioxide, silicon nitride, silicon oxynitride, or a layer structure which may comprise a combination of two or more of these materials.

The further fabrication of the FinFET may employ known process steps of an NMOS, PMOS or CMOS process. For instance, masked doping processes may be used in the further processing to fabricate in the active layer a well region and a channel region, both of a first conductivity type, and source and drain regions, both of a second conductivity type opposite to the first conductivity type.

The fabrication of the trench isolation regions and of the trench gate-isolation regions is preferably performed before the masked doping processes.

One embodiment of the method of the first aspect of the invention comprises fabricating a fin-shaped extended-drain region between the fin-shaped channel region and the drain region, the extended-drain region having the second conductivity type but a lower active dopant concentration per volume than the drain region. With the extended-drain region, a further increase of the drain-voltage capability is achieved.

Preferably, the fabrication of an extended-drain region is accompanied by fabricating field-plate isolation regions. In one embodiment that makes use of the concept of the present invention to use trench isolation regions, a suitable fabrication method additionally comprises:

fabricating trench field-plate isolation regions concurrently with the trench isolation regions and the gate isolation regions, and fabricating electrically conductive field plates on both lateral sides of the fin-shaped extended-drain region.

together with the first and second trenches, third trenches are fabricated in the active semiconductor layer on both lateral sides of the fin-shaped extended-drain region from the extended-drain-region for defining field-plate isolation regions.

The field-plates can be arranged to be integral with the gate or separated from the gate. The laterally separated arrangement improves the gate-switching performance.

The FinFET can be fabricated with either a single gate region on one of the two lateral sides of the fin-shaped channel region, or, alternatively, two separate gate regions can be fabricated isolated from each other, one on each side of the fin-shaped channel region. These gates can be operated separately or in a common mode.

The method of the first aspect of the present invention is preferably integrated into a method for fabricating an integrated circuit. The method for fabricating an integrated circuit may comprise fabricating multiple fins in parallel so as to achieve a sufficient drive current if current provided by a single cell would be insufficient.

According to a second aspect of the present invention, a FinFET is provided. The FinFET comprises:

a substrate with an active semiconductor layer on an insulator layer;

a fin-shaped channel region in the active semiconductor layer;

at least one gate region in the active semiconductor layer;

trench isolation regions filling first trenches in the active semiconductor layer, for electrically isolating different active regions in the active semiconductor layer from each other; and trench gate-isolation regions filling second trenches in the active semiconductor layer for electrically isolating the at least one gate region of the FinFET in the active semiconductor layer from the fin-shaped channel region of the FinFET in the active semiconductor layer.

The FinFET of the present invention forms a transistor, which is particularly suited for high-voltage applications, including high voltages on the gate, requiring a very compact design. It allows minimizing the total chip area of integrated circuits comprising a large number of such high-voltage transistors, such as plasma display drivers for mobile or home appliances or other power integrated circuits. With the design of the transistor of the second aspect of the invention it is possible to achieve gate voltages between 20 and 60 V or even higher voltages. In respective embodiments, the transistor can be fabricated for applications, which require a high gate voltage without process modifications or additions with respect to a base line SOI CMOS process. The same holds for alternative embodiments, which enable to apply high drain voltages. Such transistors can also be fabricated without process modifications or additions in comparison with a base line SOI CMOS process, in respective embodiments. Of course, it is also possible to combine the functionalities and fabricate transistors with high drain voltage and high gate voltage, similarly without a requirement to modify a baseline SOI CMOS process. Notably, chip area is saved in comparison with usual solutions comprising a planar transistor with a thick gate oxide. Finally, it should be noted that with the FinFET of the present invention, new applications like color display drivers are enabled to employ a standard CMOS process in fabrication. This reduces the cost per driver.

In the following, embodiments of the FinFET of the second aspect of the invention will be described. The additional features of the embodiments can be combined with each other, unless they are explicitly described as forming alternatives to each other.

In one embodiment, the trench isolation regions filling the first trenches and the trench gate-isolation regions filling the second trenches have trench widths between opposite trench walls, which differ by at most 50 nanometers. Suitably, the width difference is even less, such as 20 or 10 nanometers. In one embodiment, the respective trench widths are identical. The trench width is selected with reference to the functional requirements and to the process resolution. In modern CMOS technologies, such as commercial 65 nanometer CMOS processes, a minimum width of 110 nanometer can be achieved using a shallow-trench isolation technique.

The trench isolation regions and the trench-gate isolation regions can be connected and form a continuous trench isolation structure with different functionalities in different regions. As already described in the context of an embodiment of the method of the first aspect of the invention, it may be suitable for certain desired applications to further provide a fin-shaped extended drain region between the fin-shaped channel region and the drain region. The extended-drain region has the second conductivity type, i.e. the conductivity type of the drain region, but a lower active dopant concentration per volume than the drain region. The active dopant concentration refers to the concentration of dopants, which contribute to the conductivity. Some dopant atoms may be comprised, which are compensated in their effect by defects or dopants of the opposite conductivity type. Such compensated dopant atoms are not considered when referring to the active dopant concentration per volume.

Optionally, the drain extension can be applied also on the source side (hence source extension) to form a symmetrical transistor with source and drain extensions, where source and drain terminals are inter-exchangeable. Such a transistor thus additionally comprises a fin-shaped extended-source region between the fin-shaped channel region and the source region. The extended-source region has the second conductivity type, i.e. the conductivity type of the source region, but a lower active dopant concentration per volume than the source region. The active dopant concentration of the extended-source and extended-drain regions is in one embodiment at least approximately identical.

In another embodiment, which comprises the extended-drain region, the FinFET further comprises
electrically conductive field plates on both lateral sides of the fin-shaped extended-drain region, and
trench field-plate isolation regions isolating the fin-shaped extended drain regions from the field plates.

In a further embodiment, a single-gate FinFET comprises a body connection. Optionally, such a high-gate voltage transistor may also include gate and field-plate electrodes located above the channel region. This optional electrode may be formed by doped poly-silicon, insulated by a thick oxide (with a thickness similar to the STI width) from the channel. In this case, the electrode acts as a gate. Alternatively, it may be formed by a metal layer on top of a relatively thick pre-metal dielectric layer, in which case it would serve as an additional field plate.

BRIEF DESCRIPTION OF THE DRAWINGS

These and other aspects of the invention will be apparent from and elucidated with reference to the embodiments described hereinafter. In the following drawings

FIG. 4 shows a schematic plan view of the embodiment of a FinFET during a second stage of the fabrication method according to a method embodiment of the invention;

FIG. 5 shows a schematic cross-sectional view of the FinFET of FIG. 4 along the line V-V;

FIG. 6 shows a schematic cross-sectional view of the FinFET of FIG. 4 along the line VI-VI;

FIG. 7 shows a schematic plan view of an embodiment of a FinFET during a third stage of the fabrication method according to a method embodiment of the invention;

FIG. 8 shows a schematic cross-sectional view of the FinFET of FIG. 7 along the line VIII-VIII;

FIG. 9 shows a schematic cross-sectional view of the FinFET of FIG. 7 along the line IX-IX;

DETAILED DESCRIPTION OF EMBODIMENTS

An embodiment of a fabrication method for a FinFET be described in the following with reference to FIGS. 1 to 17. The FIGS. 1 to 17 show six different fabrication stages. Except for the last stage, for which only a plan view is provided, each fabrication stage is illustrated by three consecutive figures, which show a schematic plan view and two respective sectionals views. The sectional plans of the cross-sectional views are indicated in the associated plan view by Roman numerals, which correspond to the number of the respective figure showing the respective cross-sectional view.

Figure 1:
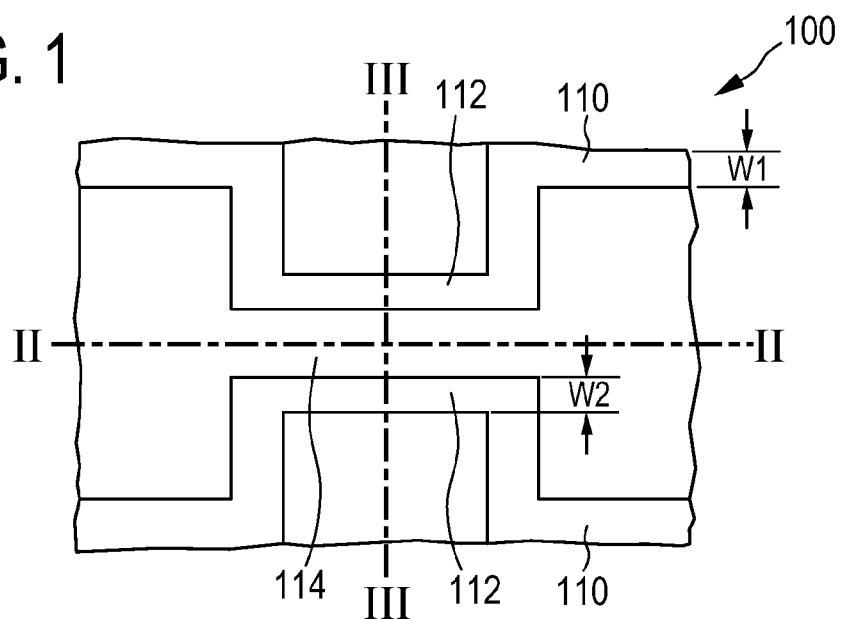
FIG. 1 shows a schematic plan view of the embodiment of a FinFET at a first processing stage of a fabrication method according to a method embodiment of the invention.
Figure 2:
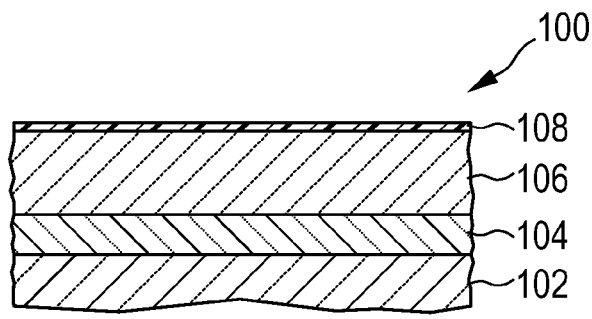
FIG. 2 shows a schematic cross-sectional view of the FinFET of FIG. 1 along the line II-II.
Figure 3:
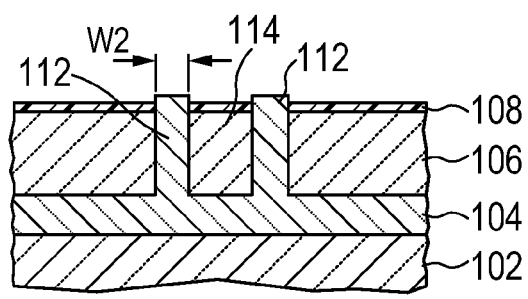
FIG. 3 shows a schematic cross-sectional view of the FinFET of FIG. 1 along the line III-III.
Figure 10:
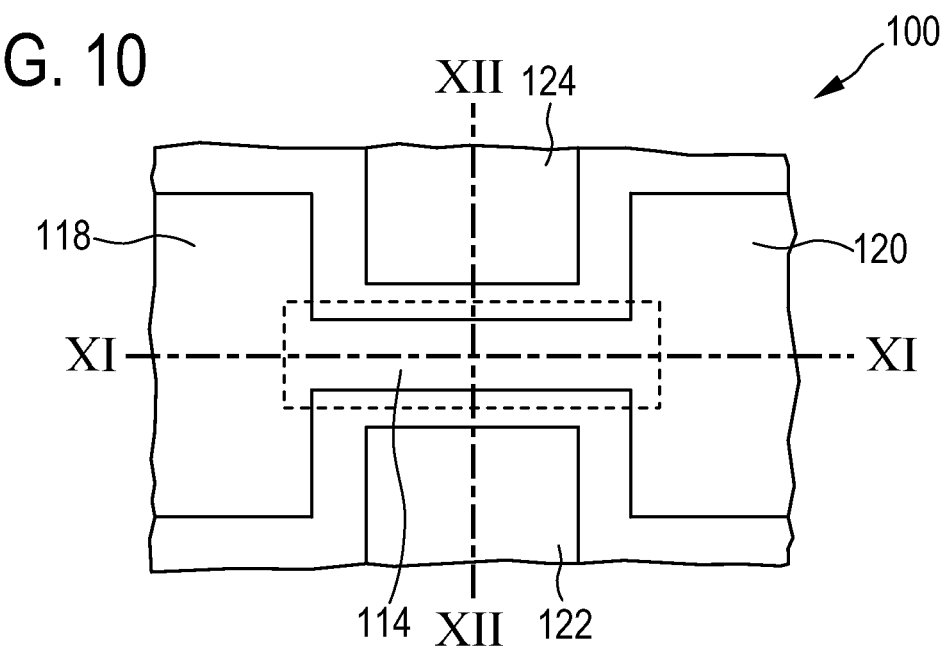
FIG. 10 shows a schematic plan view of the embodiment of a FinFET during a fourth stage of the fabrication method according to a method embodiment of the invention.
Figure 11:
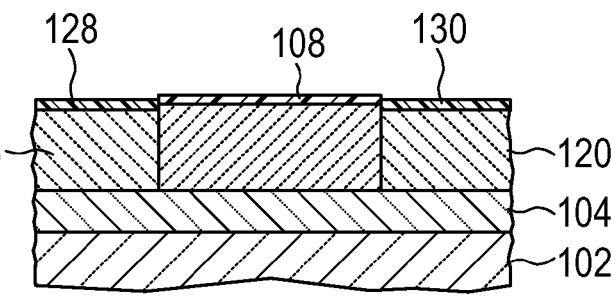
FIG. 11 shows a schematic cross-sectional view of the FinFET of FIG. 10 along the line XI-XI.
Figure 12:
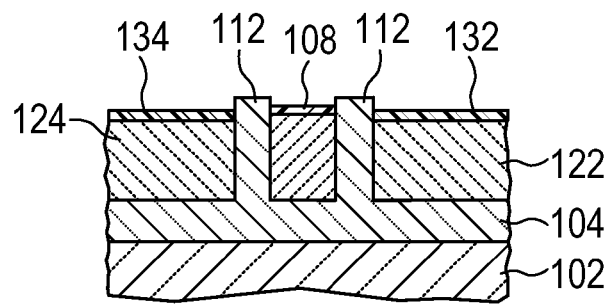
FIG. 12 shows a schematic cross-sectional view of the FinFET of FIG. 10 along the line XII-XII.

Accordingly, FIGS. 1 to 3 show a FinFET 100 during a first stage of its fabrication. Note that the fabrication of the present embodiment is embedded into a commercially applied CMOS process for the fabrication of an integrated circuit. Several processing steps of the CMOS process are not represented in the enclosed figures because they do not have relevance for the fabrication of the FinFET 100. However, they will be mentioned in the course of the following description.

Referring now to FIGS. 1 to 3 in parallel, the FinFET 100 is fabricated on a silicon-on-insulator substrate comprising a handling wafer 102, which in the present embodiment is a silicon wafer. An insulating buried silicon dioxide layer 104 covers the handling wafer 102. Silicon dioxide is herein short referred to as the "oxide". The buried oxide layer 102 is covered by a single crystalline active semiconductor layer, which in the present embodiment is a silicon layer. In another embodiment, a silicon-germanium layer is used. Other semiconductor materials could be used for the active semiconductor layer as well. Also, instead of the buried oxide layer, a buried layer of another insulating material can be used in other embodiments. The active semiconductor layer 106 is covered by a native oxide layer 108 (not shown in FIG. 1). The processing of the present embodiment includes the fabrication of trench isolation regions 110 in the active semiconductor layer 106 concurrently with trench-gate isolation regions 112. The trench isolation regions serve for electrically isolating different lateral active regions in the active semiconductor layer 106 from each other. The trench-gate isolation regions laterally define a fin-shaped channel region 114 in the active semiconductor layer 106. The channel region 114 is best recognized in the plan view of FIG. 1 and the cross-sectional view along the line III-III of FIG. 3. It is also visible in FIG. 3 that the trench-gate isolation regions 112 on both sides of the channel regions 114 extend from the substrate surface down to the buried oxide layer 104. Even though it is not visible in the FIGS. 1 to 3, the trench isolation regions 110 also extend down to the buried oxide layer 104.

The trench isolation regions and the trench-gate isolation regions are fabricated concurrently. In the present embodiment, a shallow-trench isolation (STI) process module is used for their fabrication. To this end, a lithographic process with a single mask (not shown) for defining the trench isolation regions 110 and the trench gate-isolation regions 112 is used. The STI process as such is well known in the art. It typically comprises depositing a hardmask, patterning the hardmask using a lithographic technique to define the lateral position and extension of the trenches, etching the trenches, filling the trenches with an insulating material such as silicon dioxide, planarizing the substrate, and removing the hardmask. For the present embodiment, care has to be taken to fabricate the trench gate-isolation regions 112 with a thickness that is suitable for the desired specification of the FinFET 100. I.e. the trench isolation regions 112 must be designed with a thickness that allows the application of a predetermined maximum gate voltage (for instance a maximum gate voltage of 40 V). On the other hand, it must be thin enough to allow controlling the conductivity of the fin-shaped channel region 114 of the FinFET 100 in the desired range of gate voltages.

In the present embodiment, the trench isolation regions 110 and the trench-gate isolation regions 112 have an identical width, which is indicated in FIGS. 1 as W1 and W2, respectively. That is, W1=W2 for the present embodiment. A suitable width is for instance 100 to 110 nanometer. This value corresponds to the minimum allowed STI width used in a 65 nanometer commercial CMOS process. Such a thickness of the trench gate-isolation 112 is suitable for a gate voltage as high as 40 V.

The widths of the trench isolation regions 110 and of the trench-gate isolation regions 112 can be identical or different. They may differ according to the specific needs of an application case. This can be achieved by using a correspondingly designed photolithographic mask in the STI process module for defining the trench position and extension. The lowest achievable width of the trench gate-isolation regions 112 in the present embodiment corresponds to the lowest trench width available with the STI process module. This lowest width value depends on the technology used.

The subsequent processing according to the present embodiment will be described for the example of an NMOS FinFET with two independent gates. However, it is understood that this is not a limitation of the process as such, but merely a restriction to an example. Required modifications for the fabrication of PMOS transistors concern measures, which as such are well known to a person of ordinary skill in the art. Mask designs required for a PMOS FinFET are virtually identical to those derivable from the present description of the NMOS FinFET fabrication. Transistors with different gate designs will be described further below with reference to FIGS. 18 to 21. It should be noted that a CMOS process will integrate the fabrication of both, NMOS and PMOS transistors, which may each be fabricated according to an embodiment of the present invention.

For the fabrication of the NMOS FinFET 100 a p-conductive well 116 is subsequently fabricated by a masked doping step. The p-well 116 is indicated in the plan view of FIG. 4 by a dashed outline. The p-well 116 extends in the active layer 106 underneath a future source region 118, a future drain region 120, future gate regions 122 and 124, and the channel region 114. The well extends in the active semiconductor layer 106 towards the inner substrate down to the buried oxide layer 104. A suitable dopant for fabricating the p-well 116 is boron. The doping is achieved by an implantation of boron ions using a corresponding P-well mask (not shown). For the fabrication of PMOS transistors, a corresponding doping process is performed before or after the p-well fabrication, for fabricating an n-well. Suitable dopants for fabricating an n-well are phosphorus and arsenic.

Where the processing of the present embodiment is embedded in a CMOS process, subsequent steps may be performed, which do not influence the fabrication of the FinFET 100. These processes include a formation of a gate oxide for standard planar transistors, a deposition of polysilicon and a patterning of the polysilicon and the gate oxide layer for forming gates, implantations for the fabrication of shallow extensions/pockets for planar transistors with n- or p-LDD (Lightly Doped Drain) regions. Also, a spacer formation, for instance by deposition of silicon nitride and a spacer etching step, can be inserted before continuing the processing of the FinFET 100. As shown in FIG. 7, the processing of the FinFET 100 continues with the fabrication of highly n-doped (n++) source, gate and drain regions 118 to 124. The lateral extension of the respective n++ regions is indicated by dashed lines. In this step, a masked implantation is used. A suitable dopant is for instance arsenic.

In a CMOS process, the implantation of source, drain and gate regions for PMOS FinFETs can be performed subsequently. After that, a local silicidation is performed in the source, drain, and gate regions 118 to 124, sparing only the channel region 114 by a suitable mask, the outline of which is indicated by a dashed line in FIG. 10. As a result of this processing, silicide regions 128 to 134 are provided on the source, drain, and gate region 118 to 124.

Figure 13:
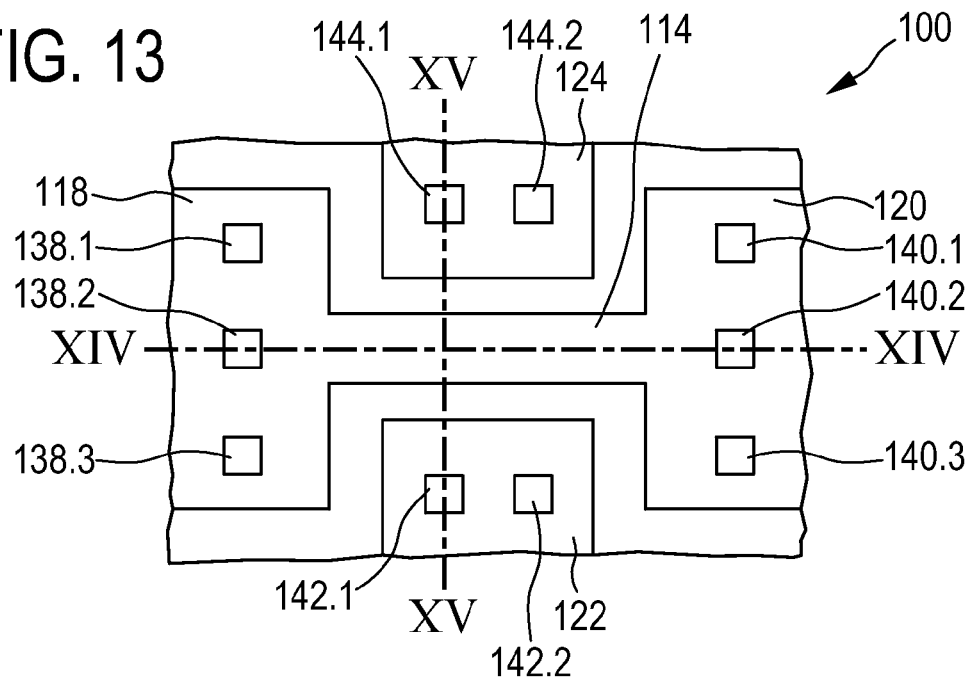
FIG. 13 shows a schematic plan view of the embodiment of a FinFET during a fifth stage of the fabrication method according to a method embodiment of the invention.
Figure 14:
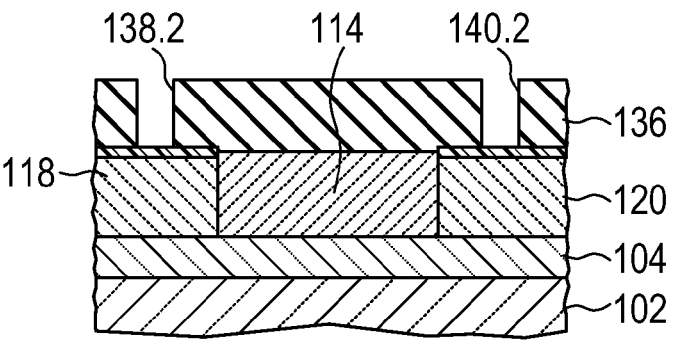
FIG. 14 shows a schematic cross-sectional view of the FinFET of FIG. 13 along the line XIV-XIV.
Figure 15:
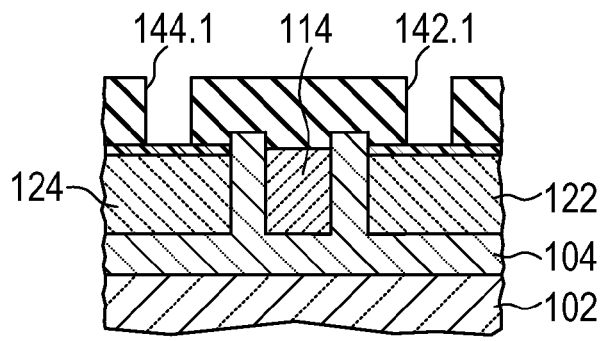
FIG. 15 shows a schematic cross-sectional view of the FinFET of FIG. 13 along the line XV-XV.

Subsequently, a pre-metal dielectric layer 136 is deposited and patterned to fabricate source contact openings 138.1 to 138.3 to the source region 118, drain contact openings 140.1 to 140.3 to the drain region 120, and gate contact openings 142.1, 142.2, and 144.1, 144.2 to the gate layers 122 and 124, respectively. The pre-metal dielectric layer 136 is not shown in the plan view of FIG. 13. FIG. 13 only shows the contact openings. However, the cross-sectional views of FIGS. 14 and 15 clearly show the pre-metal dielectric layer 136.

Figure 16:
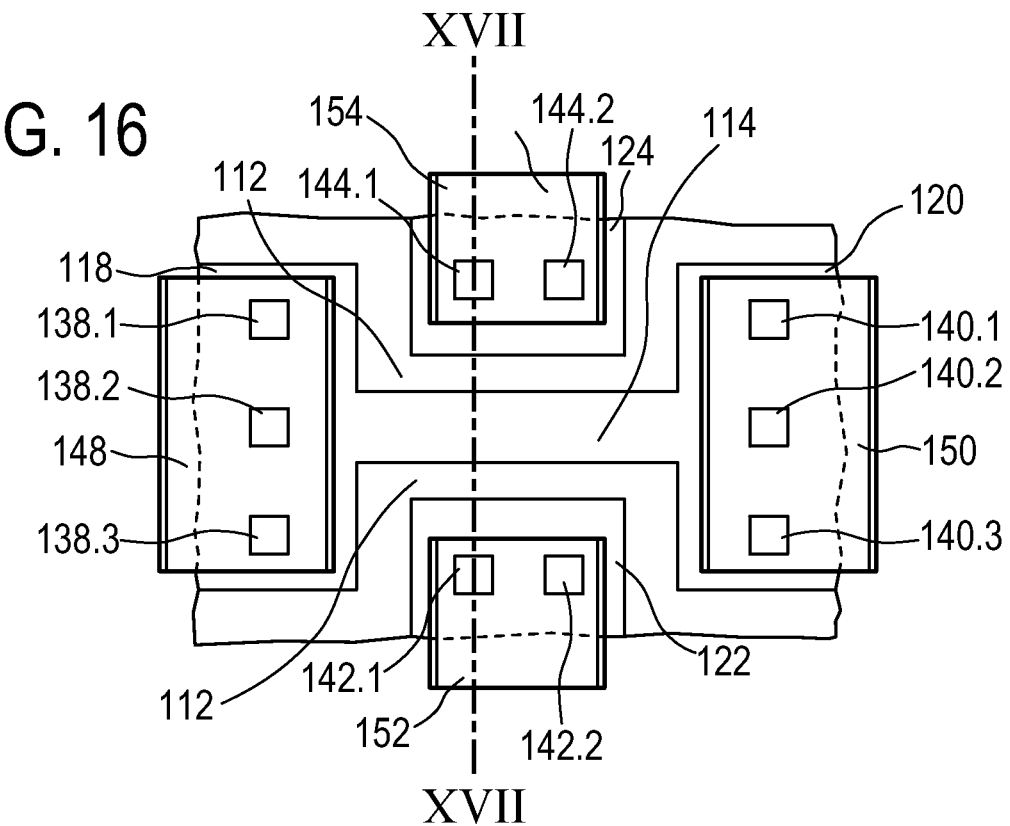
FIG. 16 shows a schematic plan view of the embodiment of a FinFET during a sixth stage of the fabrication method according to a method embodiment of the invention.
Figure 17:
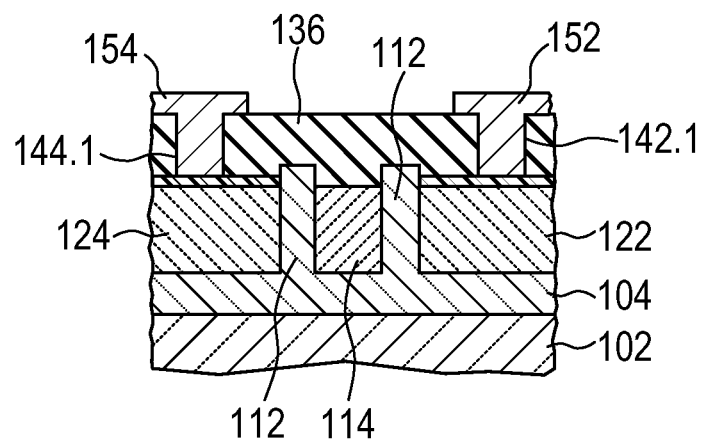
FIG. 17 is a schematic cross-sectional view of the FinFET of FIG. 16 along the line XVII-XVII.

Subsequently, a metallization is fabricated using a suitable mask layout (148, 150, 152 and 154) to finish the processing of the FinFET, as shown in FIGS. 16 and 17. The further processing of the integrated circuit comprising the FinFET 100 corresponds to known back-end-of-line (BEOL) procedures used for fabricating an interconnect stack on the integrated circuit containing the FinFET 100.

The FinFET transistor 100 not only provides a high-voltage capability on the drain, but also a high-voltage capability on the gate. The FinFET 100 is thus particularly suited for applications requiring a high gate voltage. Such high gate-voltage transistors are useful in many applications of power integrated circuits. One application case are color plasma-display drivers for mobile or home appliances. A gate voltage between 20 and 40 V is typically required here, and the transistors are required to drive only relatively small drain-source currents, which allows providing a small transistor width.

The FinFET design of the described embodiment is very compact and allows minimizing the total chip area and cost per chip. Typically, many high-voltage transistors of the type of the FinFET 100 are used per chip. In a display driver, each column and row of the display is associated with a respective separate transistor, using the FinFET of the present embodiment.

In the following, further FinFET embodiments will be presented with reference to FIGS. 18 to 21. FIGS. 18 to 21 show respective plan views of these FinFETs. The description will focus on differences between these designs and that described with reference to FIGS. 1 to 17. Reference labels for structural features corresponding to those of the embodiment of FIGS. 1 to 17 use identical combinations of second and third digits, differing thus only in the first digit from the reference labels used for corresponding features shown in FIGS. 1 to 17.

Figure 18:
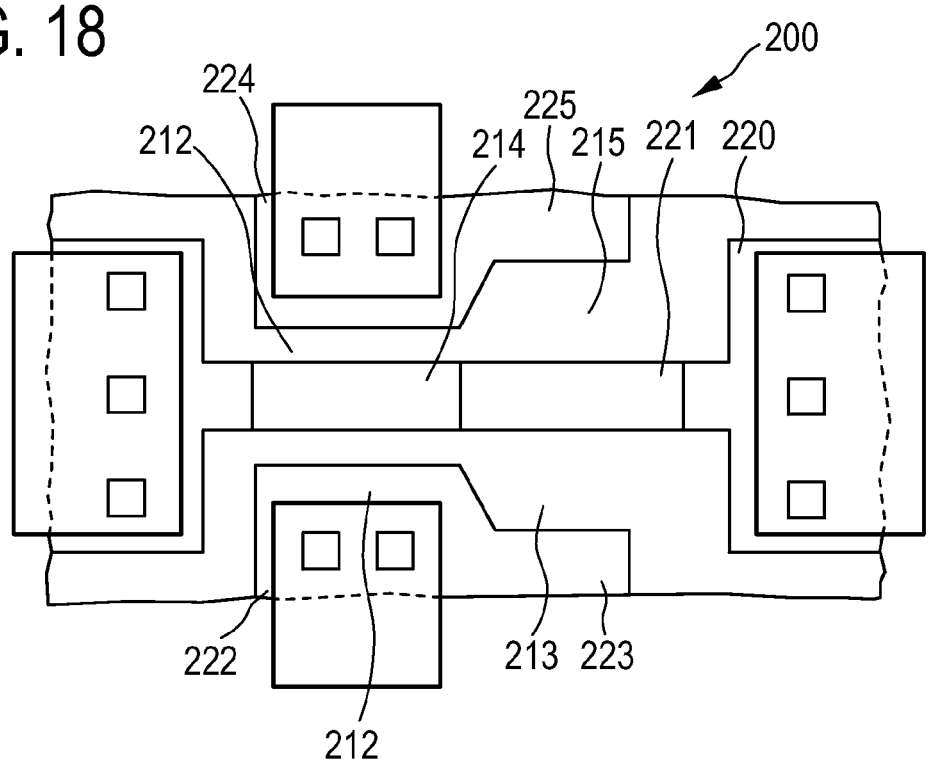
FIG. 18 is a schematic plan view of a second embodiment of a FinFET.

A FinFET 200 shown in FIG. 18 differs from that of FIGS. 16 and 17 in that it has an extended-drain region 221, which extends between the fin-shaped channel region 214 and the drain region 220. The extended-drain region is fin-shaped as well and integral with the fin-shaped p-doped channel region 214. The extended-drain region is of the same conductivity type as the drain region, but has a lower impurity concentration. In the present embodiment, the extended-drain region is n-doped.

The FinFET 200 of FIG. 18 further has field plates 223 and 225 on both lateral sides of the fin-shaped extended-drain region and integral with the gate regions 222 and 224, respectively. The field plates 223 and 225 are separated from the extended-drain region 221 by respective trench field-plates isolation regions 213 and 215. The width of the trench field-plate isolation regions is the same or larger than that of the trench gate isolation regions 212 of the FinFET 200.

Optionally the width of the extension 221 can be constant or widening from the end of the channel 214 towards the drain 220.

Figure 19:
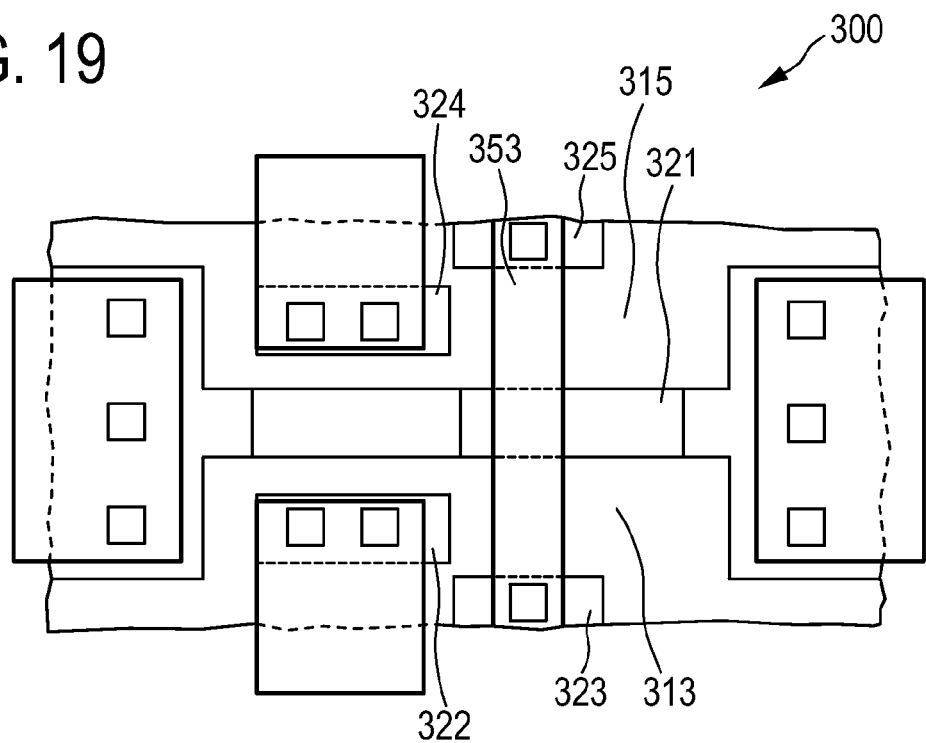
FIG. 19 is a schematic plan view of a third embodiment of a FinFET.

A FinFET 300 shown in FIG. 19 uses a similar structure as the FinFET 200 of FIG. 18. It has an extended-drain region 321 and field plates 323 and 325. However, in the embodiment of FIG. 19, the field plates 323 and 325 are separated from the respective neighboring gate regions 322 and 324. Furthermore, a separate field-plate contact 353 is provided and connected with both field-plates 323 and 325.

Figure 20:
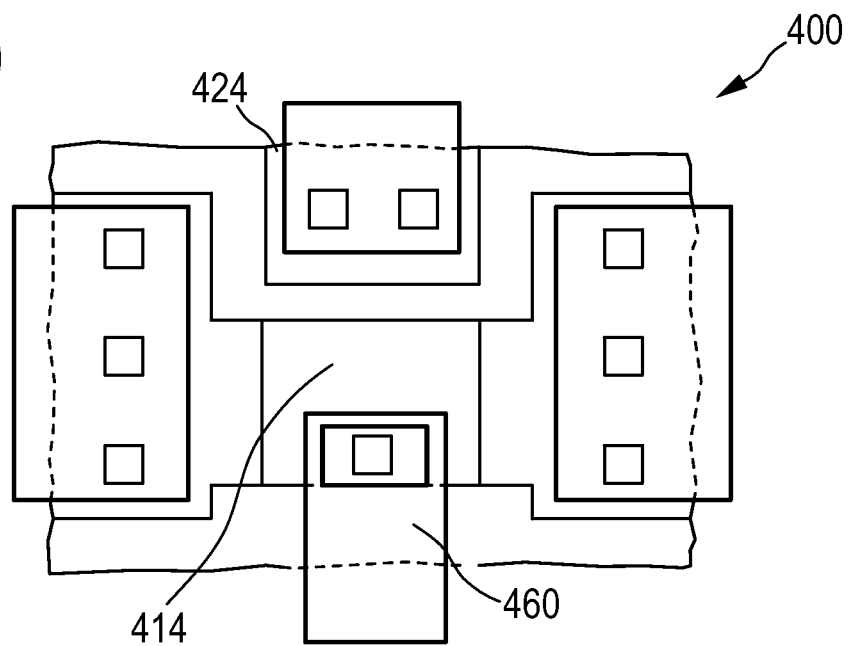
FIG. 20 is a schematic plan view of a fourth embodiment of a FinFET.

A FinFET 400 of FIG. 20 differs from that of FIGS. 16 and 17 in that it has a single gate region 424 on only one side of the fin-shaped channel region 414. Furthermore, a p-body contact 460 is provided.

Figure 21:
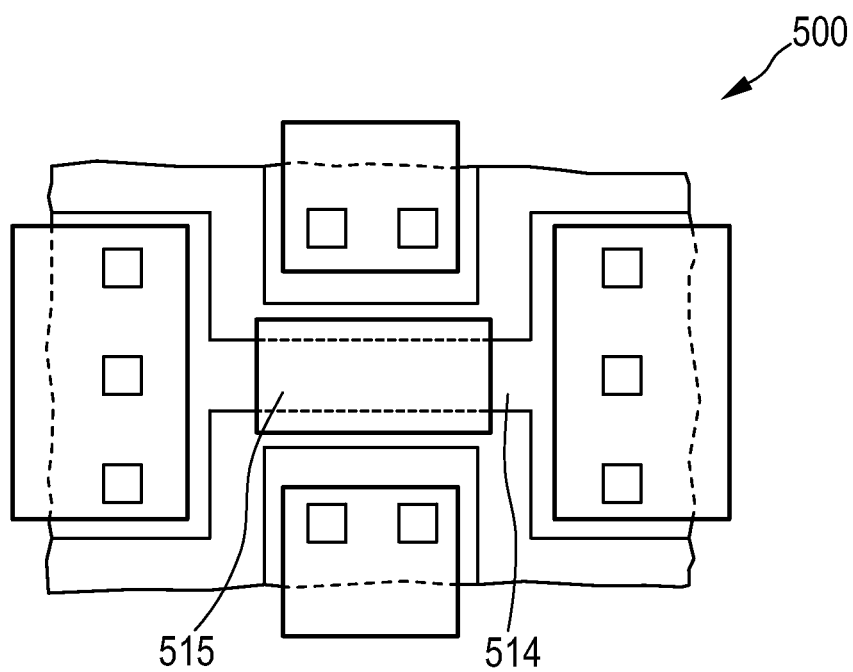
FIG. 21 is a schematic plan view of a fifth embodiment of a FinFET.

A FinFET 500 shown in FIG. 21, corresponds to that of FIGS. 16 and 17, but also includes a gate/field plate electrode 515 located above the transistor channel 514, as shown in FIG. 21. The gate/field plate electrode can also be provided in other FinFET embodiments such as the FinFET 400.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope.

The invention claimed is:

1. A method for fabricating a FinFET on a substrate, comprising:
    providing a substrate with an active semiconductor layer on an insulator layer; and
    concurrently fabricating
    a) trench isolation regions in the active semiconductor layer for electrically isolating different active regions in the active semiconductor layer from each other, and
    b) trench gate-isolation regions in the active semiconductor layer for electrically isolating at least one gate region of the FinFET in the active semiconductor layer from a fin-shaped channel region of the FinFET in the active semiconductor layer;
    wherein concurrently fabricating the trench isolation regions and the trench gate-isolation regions comprises:
    fabricating first trenches in the active semiconductor layer for the trench isolation regions and second trenches in the active semiconductor layer for the trench gate-isolation regions; and
    filling the first trenches and the second trenches with an insulating material, thus providing the trench isolation regions and the trench gate-isolation regions.

2. The method of claim 1, wherein concurrently fabricating the trench isolation regions and the trench gate-isolation regions is performed employing a lithographic process with a single mask for defining the trench isolation regions and the trench gate-isolation regions.

3. The method of claim 1, wherein providing the substrate with the active semiconductor layer comprises fabricating a silicon or a silicon-germanium layer on the insulator layer.

4. The method of claim 1, wherein filling the first and second trenches comprises depositing silicon dioxide, silicon nitride, silicon oxynitride, or a layer structure made of a combination of two or more of these materials.

5. The method of claim 1, further comprising fabricating in the active semiconductor layer, in at least two masked doping processes,
    a well region and the fin-shaped channel region, both of a first conductivity type, and
    source and drain regions on either side of the fin-shaped channel region, both of a second conductivity type opposite to the first conductivity type.

6. The method of claim 5, further comprising:
    fabricating a fin-shaped extended-drain region between the fin-shaped channel region and the drain region, the extended-drain region having the second conductivity type but a lower active dopant concentration per volume than the drain region.

7. The method of claim 6, further comprising:
    fabricating trench field-plate isolation regions concurrently with the trench isolation regions and the trench gate-isolation regions, and
    fabricating electrically conductive field plates on both lateral sides of the fin-shaped extended-drain region, wherein
    together with the first and second trenches, third trenches are fabricated in the active semiconductor layer on both lateral sides of the fin-shaped extended-drain region for defining field-plate isolation regions.

8. The method of claim 1, further comprising:
    fabricating two separate gate regions isolated from each other, one on each side of the fin-shaped channel region.

9. The method of claim 1, further comprising:
    fabricating a single gate region on one of the two lateral sides of the fin-shaped channel region.

10. A method for fabricating an integrated circuit, comprising fabricating a FinFET according to the method of claim 1.

11. A FinFET, comprising:
    a substrate with an active semiconductor layer on an insulator layer;
    a fin-shaped channel region extending between a source region and a drain region in the active semiconductor layer;
    at least one gate region in the active semiconductor layer;
    trench isolation regions filling first trenches in the active semiconductor layer, for electrically isolating different active regions in the active semiconductor layer from each other; and
    trench gate-isolation regions filling second trenches in the active semiconductor layer for electrically isolating the at least one gate region of the FinFET in the active semiconductor layer from the fin-shaped channel region of the FinFET in the active semiconductor layer;

wherein the trench isolation regions and the trench-gate isolation regions are connected, together form a continuous trench isolation structure, and are of the same material with no interface between the trench isolation regions and the trench-gate isolation regions.

12. The FinFET of claim 11, wherein the first trenches of the trench isolation regions and the second trenches of the trench gate-isolation regions have trench widths between opposite trench walls differing by at most 50 nanometers.

13. The FinFET of claim 11, further comprising a fin-shaped extended-drain region between the fin-shaped channel region and the drain region, the extended-drain region having the second conductivity type but a lower active dopant concentration per volume than the drain region.

14. The FinFET of claim 13, further comprising:
electrically conductive field plates on both lateral sides of the fin-shaped extended-drain region, and
trench field-plate isolation regions isolating the fin-shaped extended drain regions from the field plates.

15. The FinFET of claim 11, wherein the trench isolation region isolates the source region and the drain region of the FinFET from source and drain regions of laterally neighboring FinFETs.

16. The FinFET of claim 11, wherein the width of the trench isolation regions and the width of the trench-gate isolation regions are identical.

17. The method of claim 1, further comprising fabricating in the active semiconductor layer:

a well region and the fin-shaped channel region; and a source region and a drain region, the fin-shaped channel region extending between the source region and the drain region;

wherein the trench isolation region isolates the source region and the drain region of the FinFET from source and drain regions of laterally neighboring FinFETs; and wherein the at least one gate region is laterally adjacent to the fin-shaped channel region and is isolated from the fin-shaped channel region by the trench-gate isolation region.

18. The method of claim 17, wherein concurrently fabricating the trench isolation regions and the trench gate-isolation regions comprises:

fabricating first trenches in the active semiconductor layer for the trench isolation regions and second trenches in the active semiconductor layer for the trench gate-isolation regions; and concurrently filling the first trenches and the second trenches with an insulating material, thus providing the trench isolation regions and the trench gate-isolation regions.

19. The method of claim 18, wherein the channel region, the source region, and the drain region are fabricated in masked doping processes, wherein the trench isolation regions and the trench-gate isolation regions are concurrently fabricated prior to the fabrication of the channel region, the source region, and the drain region with the masked doping processes.

* * * * *